(12) United States Patent
Fujita et al.

(10) Patent No.: US 11,508,921 B2
(45) Date of Patent: Nov. 22, 2022

(54) DISPLAY DEVICE AND METHOD FOR MANUFACTURING SAME WHERE A RESIN LAYER CONTAINING AIR BUBBLES

(71) Applicant: SHARP KABUSHIKI KAISHA, Sakai (JP)

(72) Inventors: Tetsuo Fujita, Sakai (JP); Yukinobu Nakata, Sakai (JP); Hiroshi Sugimoto, Sakai (JP); Takehisa Sakurai, Sakai (JP); Masaki Fujiwara, Sakai (JP); Tokuo Yoshida, Sakai (JP); Shoji Okazaki, Sakai (JP); Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 165 days.

(21) Appl. No.: 16/982,438

(22) PCT Filed: Mar. 20, 2018

(86) PCT No.: PCT/JP2018/011145
§ 371 (c)(1),
(2) Date: Sep. 18, 2020

(87) PCT Pub. No.: WO2019/180838
PCT Pub. Date: Sep. 26, 2019

(65) Prior Publication Data
US 2021/0028378 A1 Jan. 28, 2021

(51) Int. Cl.
*H01L 51/00* (2006.01)
*H01L 51/56* (2006.01)
*H01L 27/32* (2006.01)

(52) U.S. Cl.
CPC .......... *H01L 51/0097* (2013.01); *H01L 51/56* (2013.01); *H01L 27/3244* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2013/0341601 A1* | 12/2013 | Pyo | H01L 51/529 438/22 |
| 2015/0344361 A1 | 12/2015 | Tanaka | |
| 2018/0151841 A1* | 5/2018 | Okumoto | H01L 51/0097 |
| 2020/0243782 A1* | 7/2020 | Maruyama | H01L 27/3272 |

FOREIGN PATENT DOCUMENTS

JP 2016-005901 A 1/2016

\* cited by examiner

*Primary Examiner* — J. E. Schoenholtz
(74) *Attorney, Agent, or Firm* — ScienBiziP, P.C.

(57) ABSTRACT

Provided is an organic EL display device including a resin substrate layer, a TFT layer provided on the resin substrate layer, and a light-emitting element that is provided on the TFT layer and constitutes a display region. The resin substrate layer includes a first resin layer, an inorganic layer, and a second resin layer, which are provided in that order from a side opposite to the TFT layer. The interior of the first resin layer contains a plurality of air bubbles.

6 Claims, 6 Drawing Sheets

DISPLAY DEVICE AND METHOD FOR MANUFACTURING SAME WHERE A RESIN LAYER CONTAINING AIR BUBBLES

TECHNICAL FIELD

The disclosure relates to a display device and a method for manufacturing the same.

BACKGROUND ART

In recent years, organic EL display devices, which use organic electroluminescence (EL) elements and are of the self-luminous type, have attracted attention as a display device that can replace the liquid crystal display device. As the organic EL display device, a flexible organic EL display device in which an organic EL element, a variety of films, and the like are layered on a resin substrate having flexibility, has been proposed.

For example, PTL 1 discloses an organic EL device provided with a resin substrate made of polyimide or the like.

CITATION LIST

Patent Literature

PTL 1: JP 2016-5901 A

SUMMARY

Technical Problem

In an organic EL display device, when moisture, oxygen, or the like enters into an organic EL element from the outside, the organic EL element deteriorates. In the flexible organic EL display device described above, in order to suppress the infiltration of moisture from the resin substrate into the organic EL element, it is proposed that the resin substrate has a layered structure in which an inorganic layer is interposed between a pair of resin layers. However, in this case, since the amount of resin material used increases, there is a risk that the cost of the resin substrate is increased.

The disclosure has been conceived in light of the above issue, and an object thereof is to suppress the amount of resin material used in a resin substrate in which an inorganic layer is interposed between a pair of resin layers.

Solution to Problem

To accomplish the object described above, a display device according to the disclosure is a display device including a resin substrate, a TFT layer provided on the resin substrate, and a light-emitting element that is provided on the TFT layer and constitutes a display region. The resin substrate includes a first resin layer provided on a side farther from the TFT layer, a second resin layer provided on a side closer to the TFT layer, and an inorganic layer provided between the first resin layer and the second resin layer. The interior of the first resin layer contains a plurality of air bubbles.

Advantageous Effects of Disclosure

According to the disclosure, since a plurality of air bubbles are contained in the interior of the first resin layer, the amount of use of resin material can be suppressed in the resin substrate in which the inorganic layer is interposed between the pair of resin layers.

DESCRIPTION OF EMBODIMENTS

Embodiments of the disclosure will be described below in detail with reference to the drawings. The disclosure is not limited to the embodiments described below.

FIRST EMBODIMENT

Figure 1:
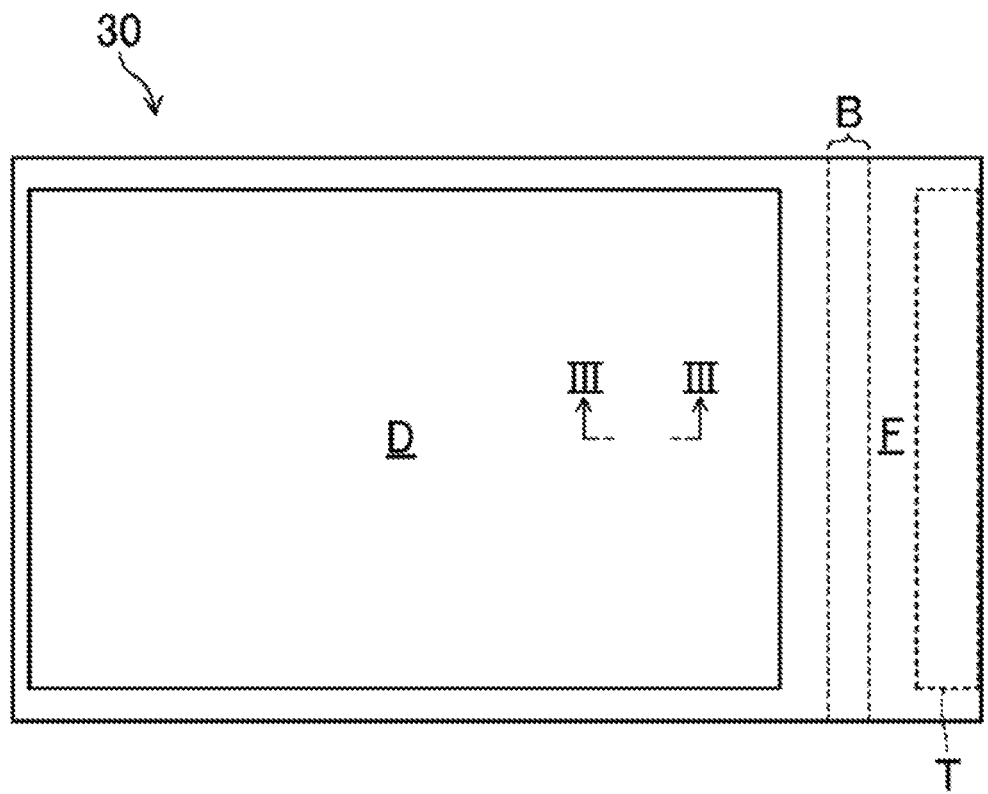
FIG. 1 is a plan view illustrating an overall configuration of an organic EL display device according to a first embodiment of the disclosure.
Figure 2:
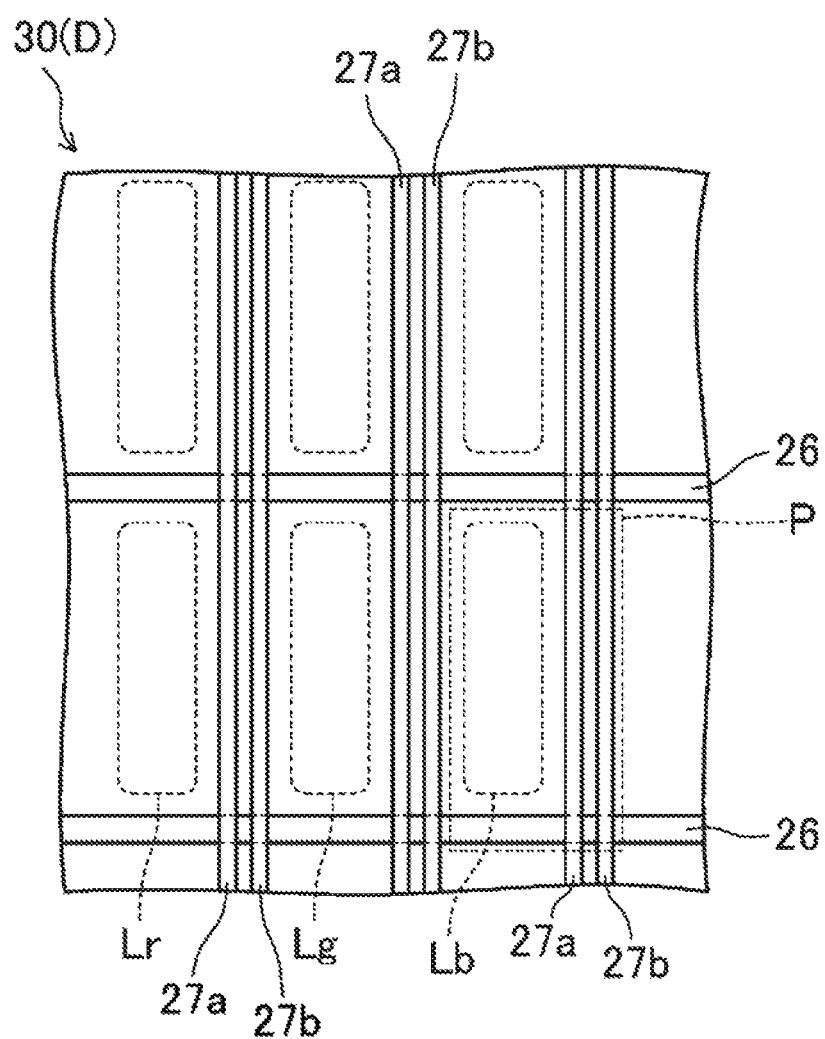
FIG. 2 is a plan view of a display region of the organic EL display device according to the first embodiment of the disclosure.
Figure 3:
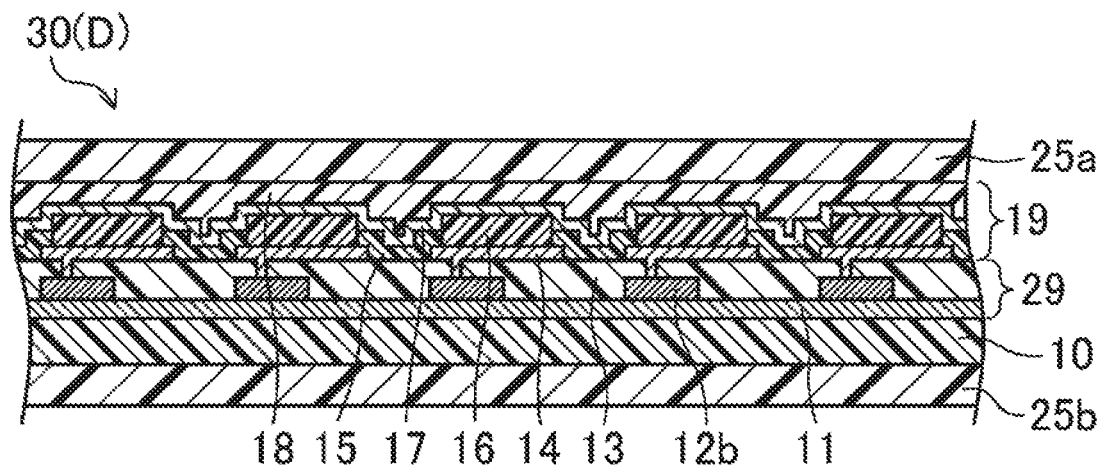
FIG. 3 is a cross-sectional view illustrating an overall configuration of the organic EL display device taken along a line in FIG. 1.
Figure 4:
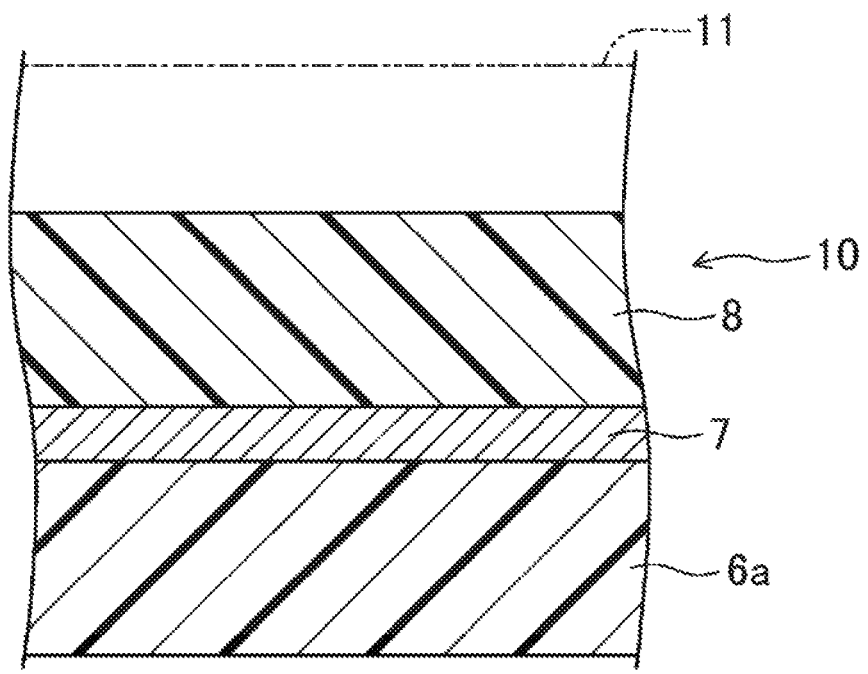
FIG. 4 is a cross-sectional view illustrating a resin substrate layer constituting the organic EL display device according to the first embodiment of the disclosure.
Figure 5:
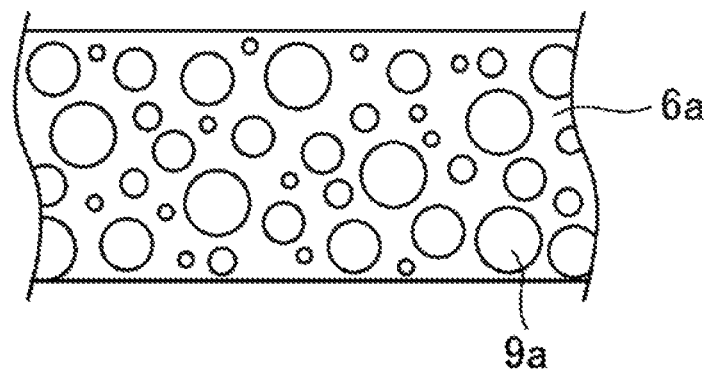
FIG. 5 is a cross-sectional view illustrating a first resin layer of the resin substrate layer constituting the organic EL display device according to the first embodiment of the disclosure.
Figure 6:
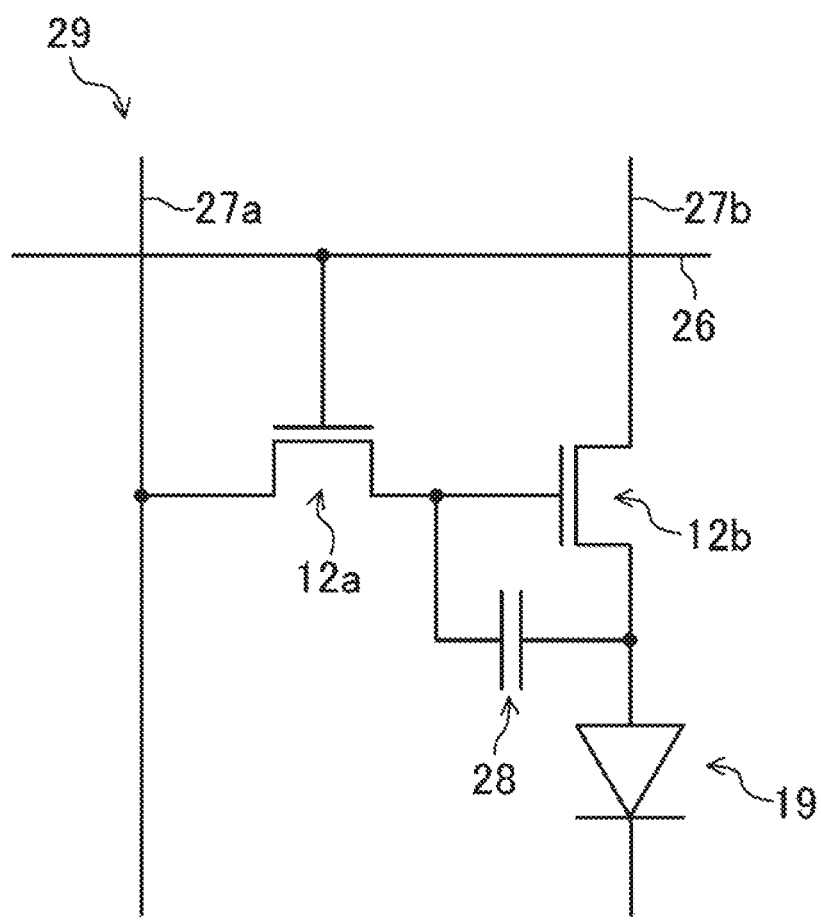
FIG. 6 is an equivalent circuit diagram illustrating a TFT layer constituting the organic EL display device according to the first embodiment of the disclosure.
Figure 7:
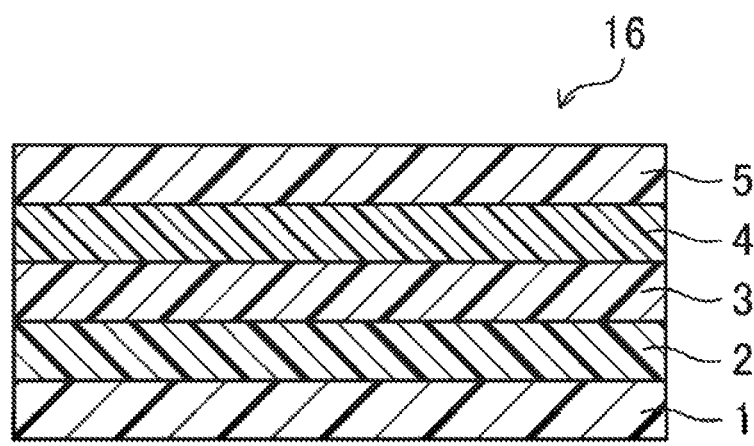
FIG. 7 is a cross-sectional view illustrating an organic EL layer constituting the organic EL display device according to the first embodiment of the disclosure.

FIG. 1 to FIG. 8 illustrate the first embodiment of a display device and a method of manufacturing the same according to the disclosure. Note that, in each of the following embodiments, an organic EL display device 30 including an organic EL element will be described as a display device including a light-emitting element. FIG. 1 is a plan view of the organic EL display device 30 of the present embodiment. FIG. 2 is a plan view of a display region D of the organic EL display device 30. FIG. 3 is a cross-sectional view of the display region D of the organic EL display device 30 taken along a line in FIG. 1. FIG. 4 is a cross-sectional view of a resin substrate layer 10 constituting the organic EL display device 30. FIG. 5 is a cross-sectional view illustrating a first resin layer 6a of the resin substrate layer 10. FIG. 6 is an equivalent circuit diagram illustrating a TFT layer 29 constituting the organic EL display device 30. FIG. 7 is a cross-sectional view illustrating an organic EL layer 16 constituting the organic EL display device 30.

As illustrated in FIG. 1, the organic EL display device 30 includes, for example, the display region D provided being formed in a rectangular shape and configured to display an image, and a frame region F provided in the periphery of the display region D. In the display region D of the organic EL display device 30, an organic EL element 19 is provided as illustrated in FIG. 3, and a plurality of pixels are arranged in a matrix shape as illustrated in FIG. 2. As illustrated in FIG. 2, in each pixel of the display region D, for example, a subpixel P including a red light-emitting region Lr configured to display a red color, a subpixel P including a green light-emitting region Lg configured to display a green color, and a subpixel P including a blue light-emitting region Lb configured to display a blue color are provided adjacent to each other. One pixel is constituted of three adjacent subpixels P including the red light-emitting region Lr, the green, light-emitting region Lg, and the blue light-emitting region Lb in the display region D. A terminal portion T is provided at the right end portion of the frame region F in FIG. 1. Further, as illustrated in FIG. 1, between the display region D and the terminal portion T in the frame region F, a bending portion B, bendable at 180 degrees (in a U shape) while taking a longitudinal direction in the drawing as a bending axis, is provided to extend along one side (right side in the drawing) of the display region D.

As illustrated in FIG. 3, the organic EL display device 30 includes the resin substrate layer 10 provided as a resin substrate, the TFT layer 29 provided on the resin substrate layer 10, the organic EL element 19 provided as a light-emitting element on the TFT layer 29, a front surface side protection layer 25a provided on a front face (upper face in the drawing) of the organic EL element 19, and a back surface side protection layer 25b provided on a back face (lower face in the drawing) of the resin substrate layer 10.

As illustrated in FIG. 4, the resin substrate layer 10 includes the first resin layer 6a provided on a side farther from the TFT layer 29, a second resin layer 8 provided on a side closer to the TFT layer 29, and an inorganic layer 7 provided between the first resin layer 6a and the second resin layer 8.

The first resin layer 6a is formed of, for example, a polyimide resin with a thickness of several micrometers to approximately 20 μm. As illustrated in FIG. 5, a plurality of air bubbles 9a are contained and dispersed in the first resin layer 6a. The diameter of the air bubbles 9a is preferably equal to or larger than 100 nm and equal to or smaller than 1.0 μm. Note that in FIG. 5, the air bubble 9a having a circular cross-sectional shape is illustrated, but the air bubble 9a of the present embodiment is not limited thereto; for example, the air bubble may be such that the cross-sectional shape thereof is oval, and in this case, the size of the long diameter preferably takes a value within the range of the above-discussed diameter.

The inorganic layer 7 is formed of a single-layer film or a layered film of an inorganic insulating film of, for example, silicon nitride, silicon oxide, or silicon oxynitride with a thickness of approximately 500 nm.

The second resin layer 8 is formed of, for example, a polyimide resin with a thickness of several micrometers to approximately 20 μm. Note that no air bubbles are contained in the second resin layer 8.

As illustrated in FIG. 3, the TFT layer 29 includes a base coat film 11 provided on the resin substrate layer 10, a plurality of first TFTs 12a (see FIG. 6) and a plurality of second TFTs 12b provided on the base coat film 11, and a flattening film 13 provided on each first TFT 12a and each second TFT 12b. As illustrated in FIG. 2 and FIG. 6, the TFT layer 29 is provided with a plurality of gate lines 26 extending in parallel to one another in a lateral direction in the drawings. As illustrated in FIG. 2 and FIG. 6, the TFT layer 29 is provided with a plurality of source lines 27a extending in parallel to one another in the longitudinal direction in the drawings. As illustrated in FIG. 2 and FIG. 6, the TFT layer 29 is provided with a plurality of power source lines 27b extending in parallel to one another in the longitudinal direction in the drawings, and each power source line 27b and each source line 27a are provided in a manner adjacent to each other. As illustrated in FIG. 6, the TFT layer 29 is further provided with, in each subpixel, the first TFT 12a, the second TFT 12b, and a capacitor 28.

The base coat film 11 is made up of a single-layer film or a layered film of an inorganic insulating film of, for example, silicon nitride, silicon oxide, silicon oxynitride, or the like.

As illustrated in FIG. 6, the first TFT 12a is connected to the corresponding gate line 26 and source line 27a in each subpixel. As illustrated in FIG. 6, the second TFT 12b is connected to the corresponding first TFT 12a and power source line 27b in each subpixel. The first TFT 12a and the second TFT 12b each include, for example, a semiconductor layer provided in an island shape on the base coat film 11, a gate insulating film provided to cover the semiconductor layer, a gate electrode provided to partially overlap with the semiconductor layer on the gate insulating film, a first interlayer insulating film and a second interlayer insulating film provided to cover the gate electrode, and a source electrode and a drain electrode disposed in a manner spaced apart from each other on the second interlayer insulating film (not illustrated). Note that, although in the first embodiment, the top-gate type is described as an example of the first TFT 12a and the second TFT 12b, the first TFT 12a and the second TFT 12b may be of the bottom-gate type.

As illustrated in FIG. 6, the capacitor 28 is connected to the corresponding first TFT 12a and power source line 27b in each subpixel. The capacitor 28 is constituted of, for example, one electrode formed with the same material in the same layer as the gate electrode, another electrode formed with the same material in the same layer as the source electrode and drain electrode, and the first interlayer insulating film and/or the second interlayer insulating film provided between the pair of these electrodes.

The flattening film 13 is formed of, for example, a colorless and transparent organic resin material, such as a polyimide resin.

As illustrated in FIG. 3, the organic EL element 19 includes a plurality of first electrodes 14, an edge cover 15, a plurality of the organic EL layers 16, a second electrode 17, and a sealing film 18, which are provided in that order over the flattening film 13.

As illustrated in FIG. 3, the plurality of first electrodes 14 are provided in a matrix shape over the flattening film 13, corresponding to the plurality of subpixels. The first electrode 14 functions to inject holes into the organic EL layer 16. It is more preferable that the first electrode 14 be formed with a material having optical transparency. It is preferable that the material for forming the first electrode 14 be, for example, a conductive oxide such as tin oxide (SnO), zinc oxide (ZnO), indium tin oxide (ITO), or indium zinc oxide (IZO). Examples of the materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of the materials that may be included in the first electrode 14 include alloys of magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), and lithium fluoride (LiF)-calcium (Ca)-aluminum (Al). Furthermore, the first electrode 14 may be formed by layering a plurality of layers of any of the above-mentioned materials.

As illustrated in FIG. 3, the edge cover 15 is disposed in a lattice pattern and surrounds the peripheral portion of the first electrodes 14. Examples of the materials for constituting the edge cover 15 include, for example, inorganic films such as a silicon oxide ($SiO_2$) film, a silicon nitride (SiNx (x is a positive number)) film like a trisilicon tetranitride ($Si_3N_4$) film and a silicon oxynitride (SiNO) film, or organic films such as a polyimide resin film, an acrylic resin film, a polysiloxane resin film, and a novolak resin film.

The plurality of organic EL layers 16 are disposed on each of the first electrodes 14 as illustrated in FIG. 3, and are provided being formed in a matrix shape in such a manner as to correspond to the plurality of subpixels (not illustrated). As illustrated in FIG. 7, the organic EL layers 16 each include a hole injection layer 1, a hole transport layer 2, a light-emitting layer 3, an electron transport layer 4, and an electron injection layer 5, which are provided in that order over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when, a voltage is applied via the first electrode 14 and the second electrode 17, holes and electrons are injected from the first electrode 14 and the second electrode 17 respectively, and the holes and electrons recombine. The light-emitting layer 3 is formed of a material having high luminous efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce the energy level difference between the second electrode 17 and the organic EL layer 16, to improve the efficiency of electron injection into the organic EL layer 16 from the second electrode 17. Because of this function, the drive voltage for the organic EL element 19 can be reduced. Note that the electron injection layer 5 is also referred to as a cathode buffer layer. Examples of materials that may constitute the electron injection layer 5 include inorganic alkali compounds such as lithium fluoride (LiF), magnesium fluoride (MgF2), calcium fluoride (CaF2), strontium fluoride (SrF2) and barium fluoride (BaF2), aluminum oxide (Al2O3), and strontium oxide (SrO).

As illustrated in FIG. 3, the second electrode 17 is disposed to cover the organic EL layers 16 and the edge covers 15. The second electrode 17 functions to inject electrons into the organic EL layer 16. It is more preferable that the second electrode 17 be formed with a material having optical transparency. It is preferable that the material for forming the second electrode 17 be, for example, a conductive oxide such as tin oxide (SnO), zinc oxide (ZnO), indium tin oxide (ITO), or indium zinc oxide (IZO). Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may be formed of, for example, an alloy of magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), lithium fluoride (LiF)-calcium (Ca)-aluminum (Al). or the like. The second electrode 17 may be formed by layering a plurality of layers of any of the above-mentioned materials. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 3, the sealing film 18 is provided to cover the second electrode 17, and functions to protect the organic EL layer 16 from moisture, oxygen, and the like. Examples of the materials for forming the sealing film 18 include inorganic materials such as silicon oxide ($SiO_2$), aluminum oxide ($Al_2O_3$), silicon nitride (SiNx (x is a positive number)) like trisilicon tetranitride ($Si_3N_4$) and silicon carbonitride (SiCN), and organic materials such as acrylate, polyurea, parylene, polyimide, and polyamide.

The front surface side protection layer 25a and the back surface side protection layer 25b are each formed with, for example, a polyethylene-terephthalate resin with a thickness of approximately 2 μm.

Figure 8:
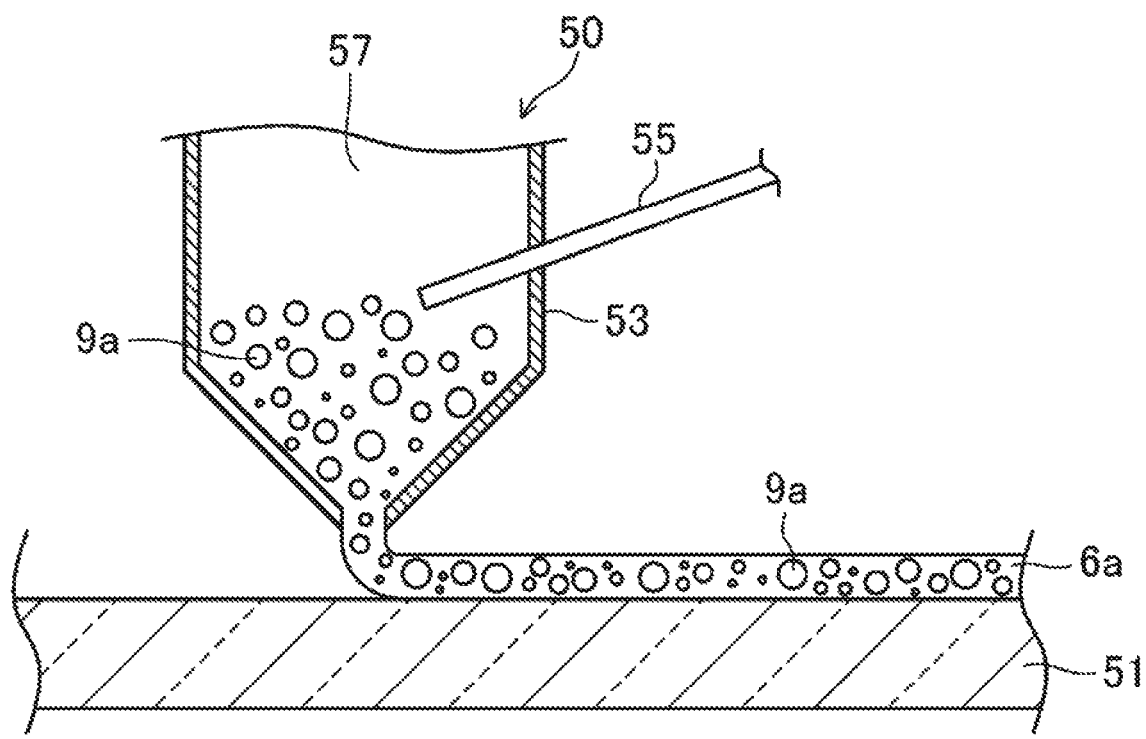
FIG. 8 is a diagram in which illustrated is forming the first resin layer in a manufacturing method for the organic EL display device according to the first embodiment of the disclosure.

A manufacturing method for the organic EL display device 30 of the present embodiment will be described next by using FIG. 8. FIG. 8 is a diagram in which illustrated is forming a first resin layer in a manufacturing method for the organic EL display device 30. The manufacturing method for the organic EL display device 30 of the present embodiment includes: forming a resin substrate in which the forming of the first resin layer, forming an inorganic layer, and forming a second resin layer are included; forming a TFT layer; and forming an organic EL element as forming a light-emitting element.

Forming Resin Substrate

First, after a resin material 57 is applied onto a glass substrate 51 (support substrate) by using a slit coater 50, the applied resin material 57 is cured to form the first resin layer 6a (forming of the first resin layer). When applying the resin material 57, as illustrated in FIG. 8, a tubular member 55 is provided in a nozzle portion 53 of the slit coater 50, and air is injected from the tubular member 55 into the resin material 57 prior to being discharged.

Subsequently, an inorganic insulating film such as a silicon nitride film, a silicon oxide film, or a silicon oxynitride film is film-formed by a plasma chemical vapor deposition (CVD) method, for example, in such a manner as to cover the first resin layer 6a having been formed in the forming of the first resin layer, thereby forming the inorganic layer 7 (forming of the inorganic layer).

Further, after the resin material is applied onto the inorganic layer 7 by using the slit coater 50, the applied resin material is cured to form the second resin layer 8 (forming of the second resin layer).

Forming TFT Layer

The base coat film 11, the first TFT 12a, the second TFT 12b, and the flattening film 13 are formed by using a known method on the resin substrate layer 10 having been formed in the forming of the resin substrate, thereby forming the TFT layer 29.

Forming Organic EL Element

The first electrode 14, the edge cover 15, the plurality of organic EL layers 16, the second electrode 17, and the sealing film 18 are formed by using a known method on the TFT layer 29 having been formed in the forming of the TFT layer, thereby forming the organic EL element 19.

Finally, by radiating laser light from the glass substrate 51 side, the glass substrate 51 is peeled off from the lower face of the resin substrate layer 10; then, the front surface side protection layer 25a is attached to the front face of the organic EL element 19, and the back surface side protection layer 25b is attached to the back face of the resin substrate layer 10.

The organic EL display device 30 of the present embodiment can be manufactured in this manner.

As described above, according to the organic EL display device 30 and the manufacturing method for the same in the present embodiment, the resin substrate layer 10 formed in the forming of the resin substrate includes the first resin layer 6a, the inorganic layer 7 and the second resin layer 8, and the interior of the first resin layer 6a contains the plurality of air bubbles 9a. This makes it possible to lower the resin density of the first resin layer 6a, so that the amount of use of the resin material 57 forming the first resin layer 6a may be suppressed in the resin substrate layer 10 in which the inorganic layer 7 is interposed between the first resin layer 6a and the second resin layer 8.

Since the interior of the first resin layer 6a contains the plurality of air bubbles 9a, the transmittance of the first resin layer 6a may be improved. Further, since the interior of the first resin layer 6a contains the plurality of air bubbles 9a, the resin substrate layer 10 may be easily partitioned.

In the forming of the first resin layer, air is injected into the resin material 57, and the resin material 57 injected with the air is applied onto the glass substrate 51 to form the first resin layer 6a. As a result, the first resin layer 6a containing the plurality of air bubbles 9a may be formed with ease.

Furthermore, since the plurality of bubbles 9a are contained inside the first resin layer 6a to be formed on the glass substrate 51, the adhesion between the glass substrate 51 and the first resin layer 6a is reduced. This makes it easy to peel the glass substrate 51 from the resin substrate layer 10.

SECOND EMBODIMENT

Figure 9:
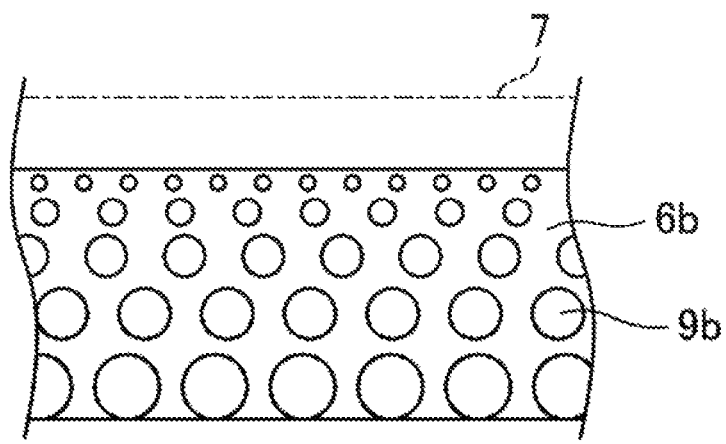
FIG. 9 is a cross-sectional view illustrating a first resin layer of a resin substrate layer constituting an organic EL display device according to a second embodiment of the disclosure.

FIG. 9 illustrates a second embodiment of a display device and a manufacturing method for the same according to the disclosure. FIG. 9 is a cross-sectional view illustrating a first resin layer 6b of a resin substrate layer 10 constituting an organic EL display device 30 of the present embodiment. Note that, in the following embodiments, portions identical to those in FIG. 1 to FIG. 8 are denoted by the same reference signs, and their detailed descriptions are omitted.

In the above-discussed first embodiment, the organic EL display device 30 provided with the resin substrate layer 10 in which the plurality of air bubbles 9a are randomly dispersed within the first resin layer 6a is exemplified. In contrast, in the present embodiment, an organic EL display device provided with a resin substrate layer in which a plurality of air bubbles 9b are aligned within the first resin layer 6b will be exemplified.

Specifically, in the organic EL display device of the present embodiment, the air bubbles 9b are provided in the first resin layer 6b in such a manner that the diameters thereof gradually become smaller toward an inorganic layer 7 in a thickness direction of the first resin layer 6b, as illustrated in FIG. 9.

Examples of the method for forming the first resin layer 6b include a method in which, in the forming of the first resin layer, the resin material 57 is layered and applied a plurality of times by using the slit coater 50 in such a manner that the diameter of each of the plurality of air bubbles 9b contained within the resin material 57 gradually becomes smaller in the thickness direction. In addition, a method is cited in which, in the forming of the first resin layer, the resin material 57 applied to the glass substrate 51 is set in a chamber and desiccated while being degassed. In the method of desiccation while degassing, large bubbles 9b move to sink toward the glass substrate 51 side (lower side in FIG. 9) at the time of degassing. According to the configuration of the present embodiment, as compared to the configuration of the first embodiment, it is possible to further reduce the adhesion between the glass substrate 51 and the first resin layer 6b, and peel the glass substrate 51 from the resin substrate layer 10 more easily.

THIRD EMBODIMENT

Figure 10:
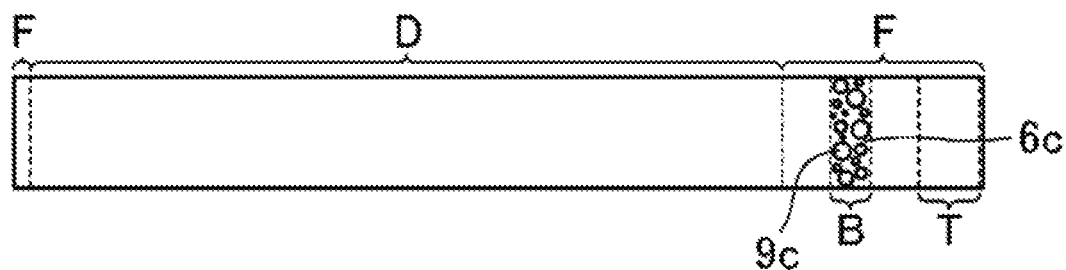
FIG. 10 is a cross-sectional view illustrating a first resin layer of a resin substrate layer constituting an organic EL display device according to a third embodiment of the disclosure.

FIG. 10 illustrates a third embodiment of a display device and a manufacturing method for the same according to the disclosure. FIG. 10 is a cross-sectional view illustrating a first resin layer 6c of a resin substrate layer 10 constituting an organic EL display device 30 of the present embodiment.

In the embodiments described above, the organic EL display device 30 is exemplified in which the plurality of air bubbles 9a or 9b are provided entirely in a plan view within the first resin layer 6a or 6b. In contrast, in the present embodiment, as illustrated in FIG. 10, an organic EL display device is exemplified in which a plurality of air bubbles 9c are provided partially in a plan view.

Specifically, in the organic EL display device of the present embodiment, the plurality of air bubbles 9c are provided inside the first resin layer 6c in a bending portion B of a frame region F.

According to the present embodiment, stress when bending the bending portion B is alleviated, so that the organic EL display device 30 is easily bent at the bending portion B.

In the present embodiment, the organic EL display device is exemplified in which the plurality of air bubbles 9c are partially provided at the bending portion B, but the location where the plurality of air bubbles 9c are partially provided may be a location other than the bending portion B. Note that the portion of the first resin layer 6e where the plurality of air bubbles 9c are provided is a portion having higher transmittance than the portion where the plurality of air bubbles 9c are not provided.

Other Embodiments

In the above-described embodiments, the example of the organic EL layer in the five-layer structure including the hole injection layer, the hole transport layer, the light-emitting layer, the electron transport layer, and the electron injection layer is given. It is also possible that, for example, the organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In the above-described embodiments, the example of the organic EL display devices in which the electrode of the TFT connected to the first electrode serves as the drain electrode is given. However, the disclosure is also applicable to an organic EL display device in which the electrode of the TFT connected to the first electrode is referred to as the source electrode.

Although the foregoing embodiments describe organic EL display devices as examples of display devices, the disclosure may be applied in display devices including a plurality of light-emitting elements that are driven by an electrical current. For example, the disclosure is applicable to display devices including quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:

1. A manufacturing method for a display device, the method comprising:
    forming a resin substrate on a support substrate;
    forming a TFT layer on the resin substrate; and
    forming a light-emitting element on the TFT layer,
    wherein the forming of the resin substrate includes forming a first resin layer on the support substrate, forming an inorganic layer on the first resin layer, and forming a second resin layer on the inorganic layer, and
    in the forming of the first resin layer, the first resin layer is formed in such a manner that an interior of the first resin layer contains a plurality of air bubbles,
    wherein in the forming of the first resin layer, air is injected into a resin material, and the resin material injected with the air is applied onto the support substrate to form the first resin layer.

2. The manufacturing method for the display device according to claim 1,
    wherein in the forming of the first resin layer, the first resin layer is formed in such a manner that a diameter of each of the plurality of air bubbles becomes smaller toward the inorganic layer in a thickness direction of the first resin layer.

3. The manufacturing method for the display device according to claim 2,
    wherein in the forming of the first resin layer, the resin material is layered and applied a plurality of times.

4. The manufacturing method for the display device according to claim 2,
    wherein in the forming of the first resin layer, the resin material applied onto the support substrate is desiccated while being degassed.

5. The manufacturing method for the display device according to claim 1, wherein the light-emitting element is an organic EL element.

6. The manufacturing method for the display device according to claim 1,
    wherein the first resin layer and the second resin layer are each formed of a polyimide resin.

* * * * *